United States Patent [19]

Vancelette

[11] 4,320,339

[45] Mar. 16, 1982

[54] COMPONENT TESTING STATION

[75] Inventor: Stanley R. Vancelette, Manchester, N.H.

[73] Assignee: USM Corporation, Farmington, Conn.

[21] Appl. No.: 35,929

[22] Filed: May 3, 1979

Related U.S. Application Data

[63] Continuation of Ser. No. 848,900, Nov. 7, 1977, abandoned.

[51] Int. Cl.³ .......................... G01R 31/00; B07C 5/08
[52] U.S. Cl. ................................ 324/73 AT; 198/343; 209/548; 209/573; 324/158 F; 339/252 F
[58] Field of Search .......... 324/73 AT, 158 F, 158 D; 209/556, 548, 914, 916, 918, 921, 571–574; 339/252 F, 253 F, 258 F; 198/341, 343

[56] References Cited

U.S. PATENT DOCUMENTS 3,573,580 11/1970 Beroset ................................. 209/573
4,119,206 10/1978 Woodman, Jr. et al. ........... 209/548

Primary Examiner—Ernest F. Karlsen
Attorney, Agent, or Firm—Alan N. McCartney; Owen J. Meegan

[57] ABSTRACT

A station for testing electrical components is provided with spaced pairs of cooperative lead-engageable contacts, these pairs being yieldingly openable to arrest a lead arriving therebetween for the test. At least one contact of each pair has an abrading edge which may be shaped to penetrate transversely any wire oxidation of the lead to obtain accurate electrical measurement though requiring only low contact force.

11 Claims, 9 Drawing Figures

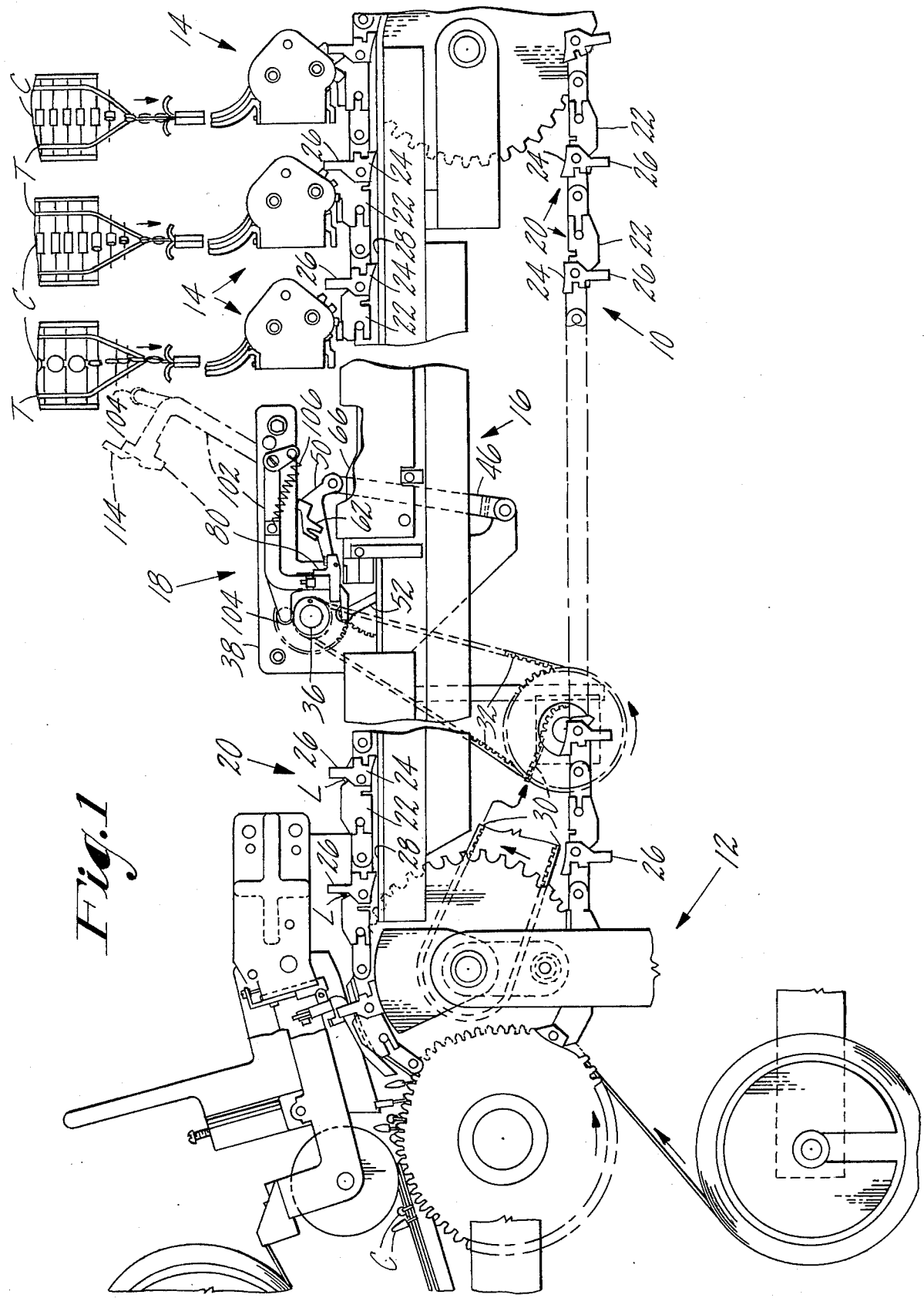

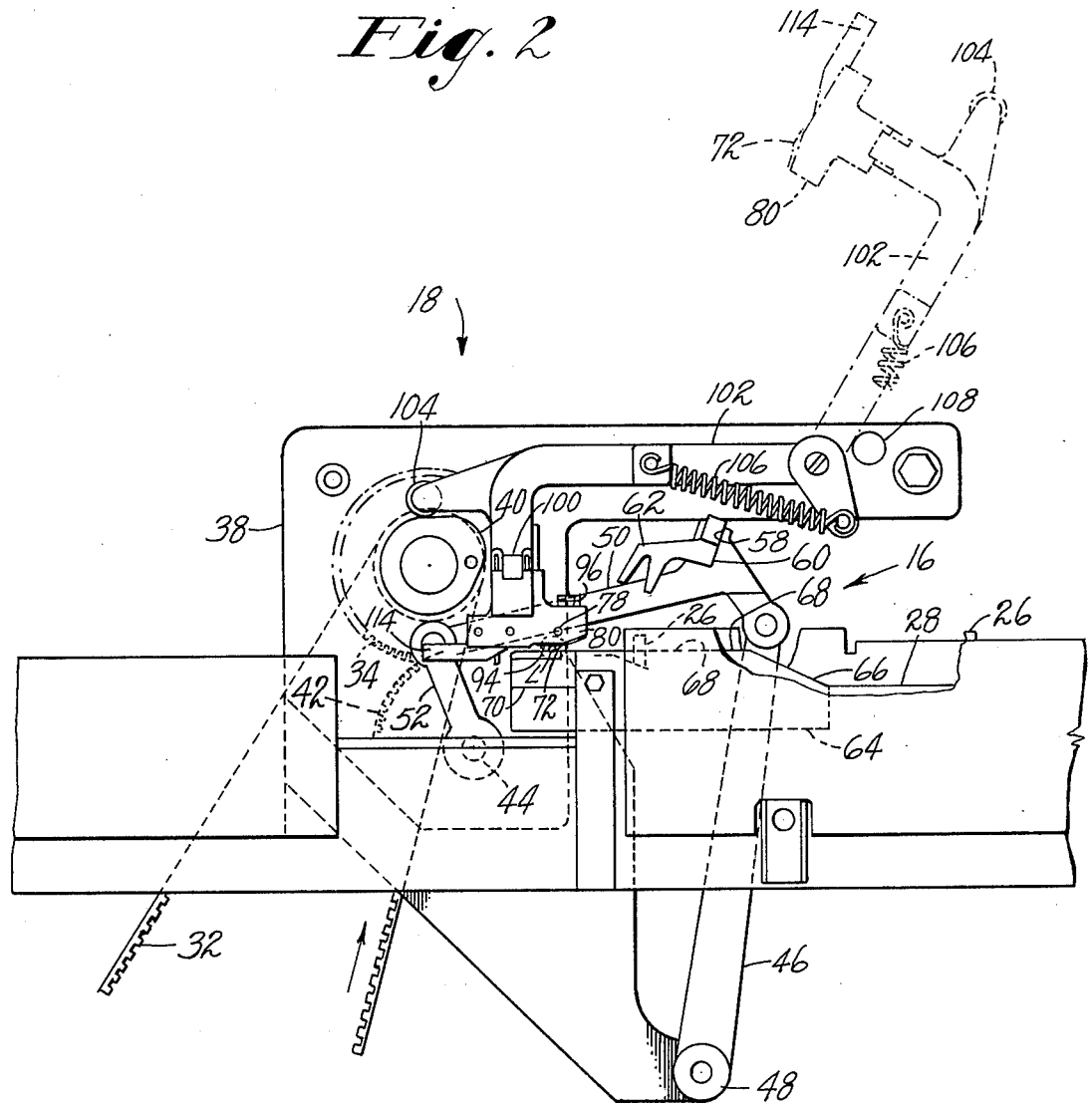

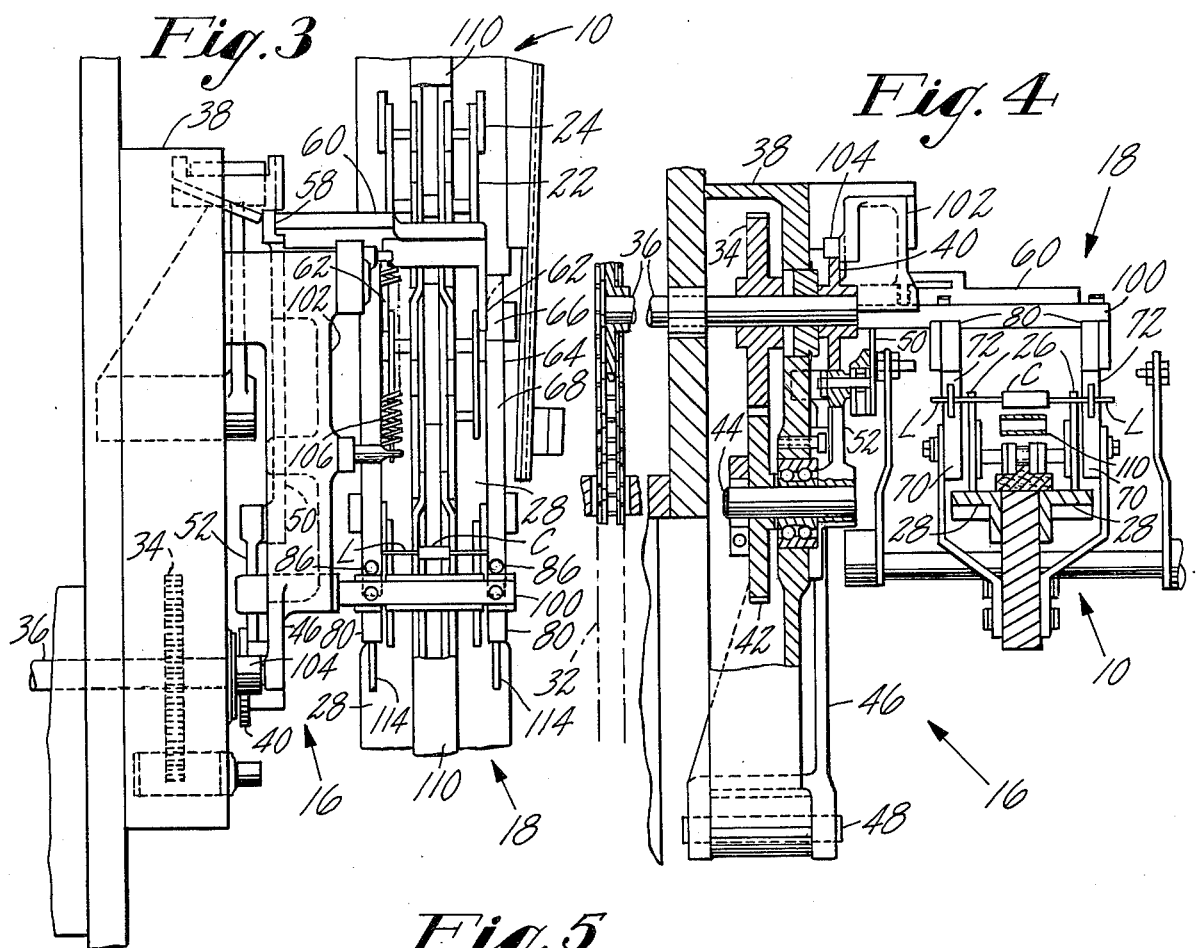
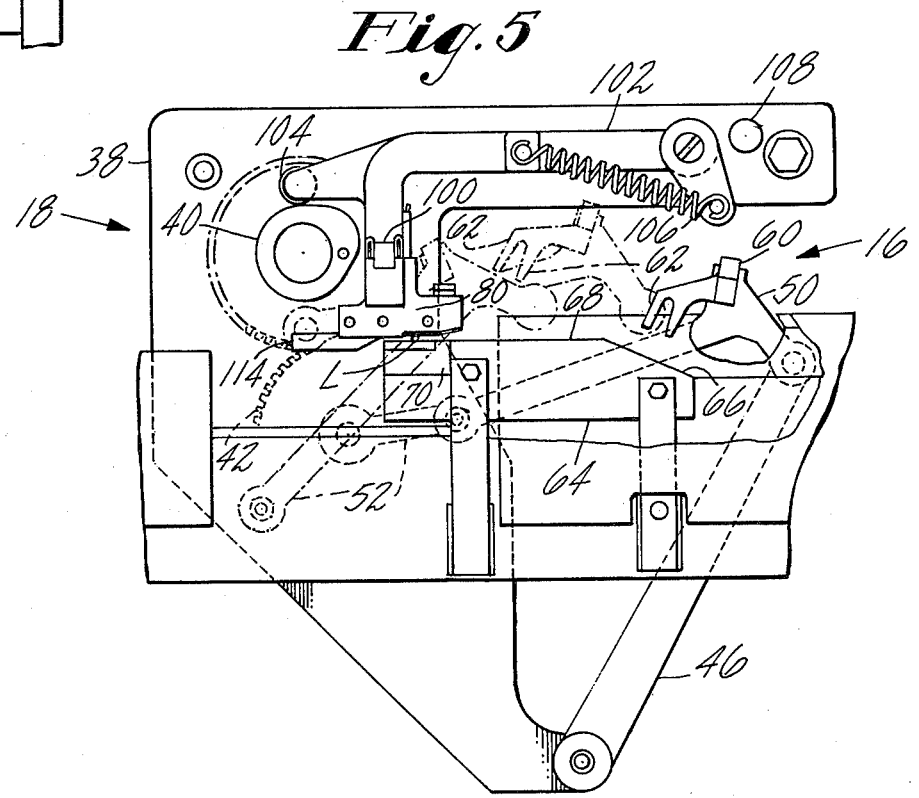

COMPONENT TESTING STATION

This application is a continuation of my copending application, Ser. No. 848,900, filed Nov. 7, 1977, now abandoned.

CROSS-REFERENCE TO RELATED APPLICATION

U.S. Pat. No. 4,119,206 in the names of Daniel W. Woodman, Jr. and Stanley R. Vancelette, and assigned to the same assignee, relates to a component sequence testing station.

BACKGROUND OF THE INVENTION

This invention relates to mechanism for testing electrical components.

More particularly, the invention is concerned with providing an improved testing station for reliably and automatically determining electrical acceptability of each of a series of electronic components which are to be processed one after another at a rapid rate.

While the present invention has application to mechanism for verifying conformity of components electrically to predetermined standards and/or sequence, it is to be recognized that application of the invention is not limited to a sequence verifying arrangement, and utility of this invention is to be appreciated whether testing is associated with intermittently operated equipment or continuously operated mechanism.

As noted in the above-cited application, some U.S. prior art patents are U.S. Pat. Nos. 3,236,374; 2,896,314; 3,073,446; 3,240,336 and 3,366,235. That application discloses, for instance for use in a continuously operative component sequenching machine, a component test station arranged adjacent to a component feeding means. The test station as therein illustrated, comprises, in addition to a means for accelerating successive delivery of each component to the station, pairs of cam-controlled electrical contacts respectively closeable on each lead when it has been positioned therebetween. The test station of the invention herein disclosed, in addition to affording greater simplicity and reliability includes novel distinguishing features hereinafter to be described, and enables elimination of an auxiliary test station.

SUMMARY OF THE INVENTION

It accordingly is a main object of the present invention to provide a test station for electrical components having leads, which station shall comprise effective lead engaging contacts requiring only low control-operating force.

Another object is to provide an improved electric component test station automatically operable on successive lead-bearing components and including a novel lead contacting arrangement whereby increased test cycle time is gained and the stop and test position of each component is determined.

Yet another object of the invention is to provide an automatic device or station for accurately determining electrical acceptability of electrical components by spaced engagements with their respective wire leads, the device or station having the lead contacts shaped to penetrate, during relative arresting of the leads thereby, any oxidized exterior of the leads prior to and during testing while requiring only low, non-leadbending, contact operating force.

To these ends, and as herein shown, means is provided for feeding the leads of successive components along a path, and a station for testing the components, respectively, has at least one pair of electrical contacts adjacent to the path which are yieldingly separable on being engaged by a lead arriving therebetween. Preferably both contacts of each of two spaced pairs are formed with at least one abrading or acute edge adapted to penetrate any oxidized exterior of the engaged lead. Each lead engaging blade is disposed transversely of the successive side-by-side component leads, the blades being aligned to insure good electrical contact at spaced localities during arresting of the lead wire and during the testing interval while the component is stopped. Provision of each contact with a pair of such parallel blades aids in preventing skewing of the component from its path and avoids tendency, it any, to bend the leads during test.

BRIEF DESCRIPTION OF THE DRAWINGS

The foregoing and other features of the invention will now be more particularly described in connection with an illustrative embodiment and with reference to the accompanying drawings thereof, in which:

FIG. 1 is a view in side elevation, with portions broken away, of a component sequencing and taping machine having sequence testing or verifying mechanism according to this invention disposed along a component conveyor;

FIG. 2 is a view in side elevation, and on a larger scale of portions of the verifying and component transfer mechanism shown in FIG. 1;

FIG. 3 is a plan view of the transfer and verifying mechanism;

FIG. 4 is a view in end elevation of parts shown in FIG. 3 but with portions broken away to show details of driving means;

FIG. 5 is a view similar to FIG. 2 but showing the parts at different positions in a cycle;

DESCRIPTION OF THE PREFERRED EMBODIMENT

Figure 6:
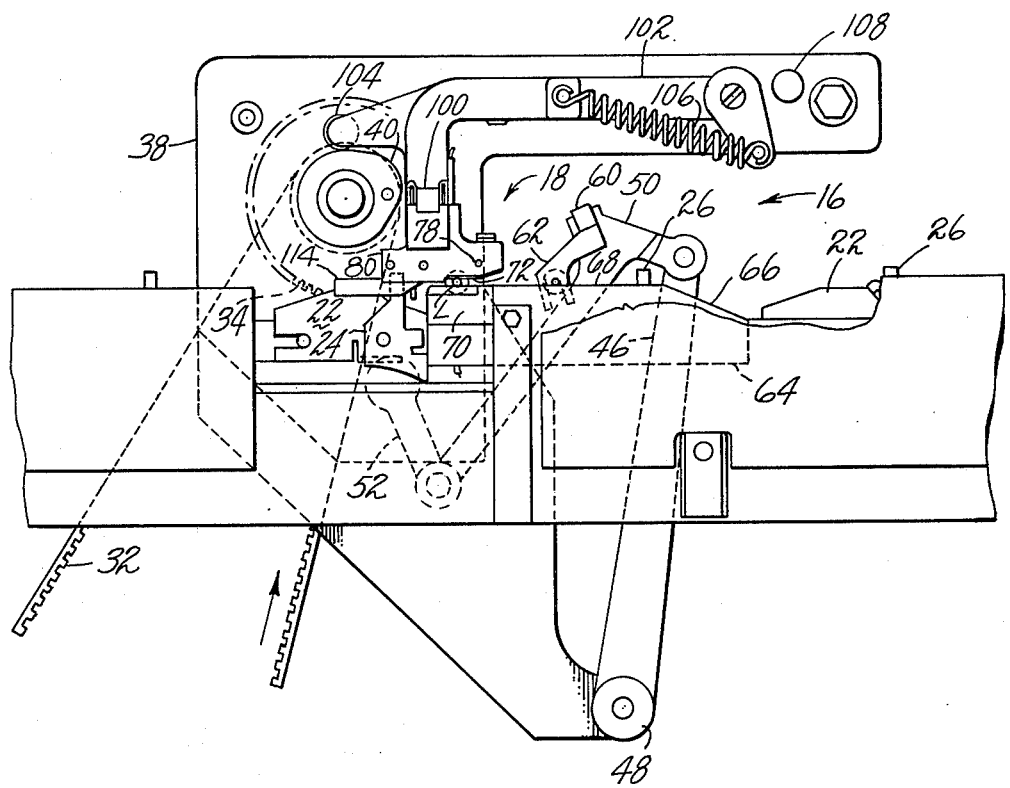
FIG. 6 is a view similar to FIG. 5 but indicating one component leaving the test station as another is about to be delivered thereto.

Although the embodiment selected for purposes of illustration pertains to a machine programmed to produce electrically tested reels of sequenced components with lead-taped spacing to match requirements of component insertion machines, the invention is not thus limited in use. The drawings largely correspond to those of the cited copending application for ease of comparison.

For the sake of convenience, and not by way of limitation, the invention will hereinafter be described as embodied in machines of the general type disclosed in the U.S. Pat. Nos. 3,669,309 and 3,971,193. These employ a continuously operative endless conveyor of chain-type generally designated 10 (FIGS. 1, 2, 6 and 7) for carrying an uniformly spaced side-by-side relation a succession of components C (not necessarily alike physically or electrically) having at least partly coaxial leads L to be re-taped and then reeled at a station 12 (FIG. 1). It will be understood that the components C, initially fed by tape T from their respective dispensers 14 arranged along the conveyor, are successively indexed and individually released to the conveyor according to programming means not herein shown.

In addition to the conveyor 10, the dispensers 14, and the station 12 being assumed essentially to correspond with the patented structure referred to, it is also herein assumed for purposes of convenience that component accelerative or transfer mechanism 16 (substantially corresponding to that generally designated 30 in the cited copending application) is employed to shift successive components in the direction of conveyor feed toward a novel component testing station generally designated 18. The conveyor 10 and/or the transfer mechanism 16 thus clearly are incidental to supplying successive components C cyclically to the station 18, but are not essential to practice of the present invention, other component presenting means of various types and structure also being clearly useful therewith as different circumstances or testing conditions may require or make desirable.

The conveyor 10 comprises uniformly spaced, lead-engaging carriers 20 including, respectively, a pair of leading side plates 22 and a pair of trailing side plates 24. Pivotal relation of upstanding pick-off fingers 26 of the plates 24 to the leading plates 22 is controlled by cam means which, along the upper conveyor reach, constitutes a fixed, horizontal pair of parallel cam tracks 28 secured to the conveyor frame. It will thus be understood that upon passing from beneath delivery ends of the series of dispensers 14, each pair of fingers 26 is rapidly advancing a component C (leftward as seen in FIG. 1) toward the station 12, and it is important to ascertain prior to its arrival thereat if the component is acceptable for its intended use as determined by the test station 18.

The transfer mechanism 16 (FIGS. 2–5 and 7) is upstream of the conveyor from the test station 18 which is itself upstream from the subsequent processing station, for instance that at the station 12. Though not herein fully shown, the conveyor 10 may be driven by power means including a drive chain 30 (FIG. 1) having operative connection to a timing belt 32 (FIGS. 1–4) provided for actuating the transfer mechanism 16 and the test station 18 in synchronism as will next be described. For this purpose the belt 32 drives a gear 34 journalled on a shaft 36 in a housing 38 (FIG. 3) fixedly mounted on the conveyor frame. The shaft 36 carries a rotary cam 40 for controlling cyclical testing by the station 18, and the gear 34 meshes with a gear 42. The latter rotatably drives a stub shaft 44 journalled in the housing 38 for controlling a four-bar linkage constituting the mechanism 16. As shown in FIGS. 2–7, this linkage comprises a crank arm 46 pivotally supported at its lower end on a pin 48 secured to the housing, a connecting rod 50 for accelerating downstream travel of each successive component C, and a short crank arm 52 the angular input speed of which is derived from the stub shaft 44 journalled in the housing 38.

The connecting rod 50 is slotted at 58 (FIG. 2, 7) to secure thereto a cross bar 60 formed with a pair of widthwise spaced, lead-engaging pickers 62,62. Aligned with the aforementioned cam tracks 28,28 is a pair of stationary cam plates 64,64 extending in parallel through the test station. Each plate 64 has an inclined lead-engaging ramp portion 66 disposed for cooperation with successive fingers 26 thus to raise advancing leads L heightwise onto a lead-supporting, horizontal rail portion 68. The latter extends into the test station and cooperates with the pickers 62 as they are caused to receive the lifted leads L,L and to accelerate and then decelerate them downstream relative to the fingers 26 and into the test station 18.

Figure 8:
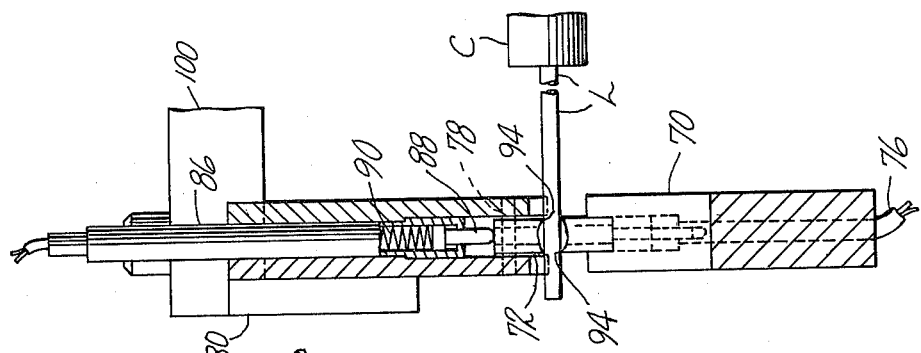
FIG. 8 is an enlarged section showing a lead in test or contact-engaging position.
Figure 9:
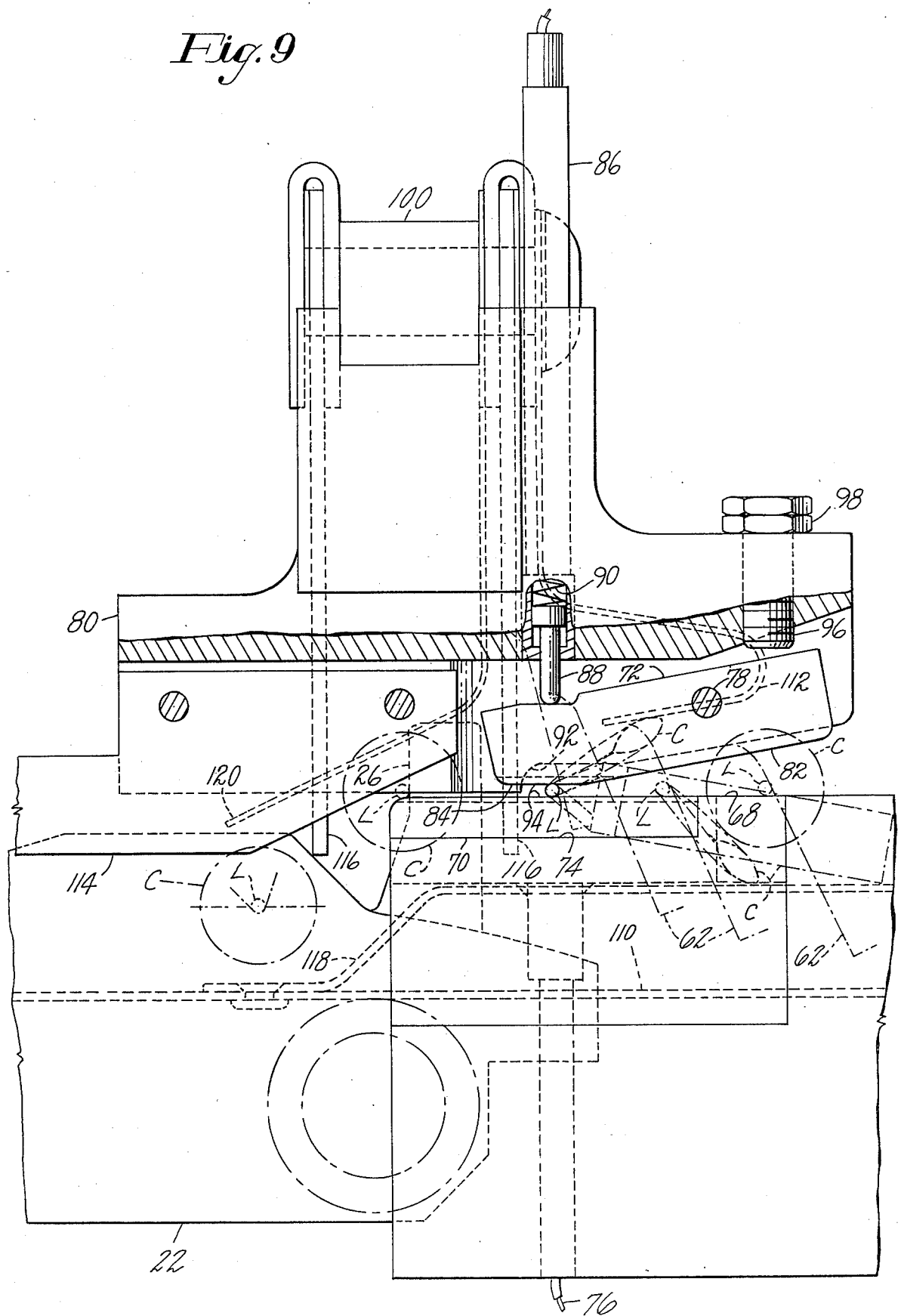
FIG. 9 is an enlarged view in vertical section showing the contacts in component testing position, and other components behind and ahead of that position.

The arrangement being described is such that as the leads L of each component arrive at the station 18, they are respectively urged by the pickers between pairs of lower, fixed electrical contents 70 (FIG. 7–9) and pairs of upper, relatively closed when operative, but upwardly movable and yieldable electrical contacts 72. The contacts 70 are removably mounted in the conveyor path on shoulders or cut-away portions 74 and formed, respectively, as horizontal extensions of the rail portions 68 and have connection by means of wires 76 to suitable test circuitry not herein shown. The upper contacts 72 of each vertically aligned set of contacts 70,72 are pivotally supported on a pin 78 secured in supports 80, respectively. A leading under surface 82 (FIG. 9) of each of the contacts 72 is inclined downwardly toward the adjacent fixed contact 70 to restrain the leads arriving thereagainst; and a trailing under surface 84 of each movable contact 72 is yieldingly urged counterclockwise about the pin 78 as seen in FIG. 9, for convergent relation to the adjacent contact 70, and may be positioned against that fixed contact 70. For this purpose an electrically conductive terminal pin 86 (FIGS. 8, 9) mounted in the support 80 has a plunger 88 bearing downwardly on the respective contacts 72 by reason of a spring 90 fitted in the lower end of the terminal pin.

It is of particular importance to note that the cooperative contacts 70,72, on being relatively separated heightwise by lead engagement therewith, aid in decelerating and arresting the respective leads as they arrive for component testing. A curved under surface 92 (FIG. 9) of the support 80 serves, if necessary, as a stop positively to prevent the leads from passing through the test zone without stopping for static measurement. Also of considerable significance is the fact that preferably both of the lead-engaging surfaces of the contacts 70,72 are formed with at least one abrading or knife edge. Preferably, as shown in FIG. 8, each contact has a pair of parallel, adjacent knife edges 94,94 extending transversely of the lead and these edges are aligned on opposite sides of the lead thereby enabling penetration of any surface oxidizing of the leads and insuring good, reliable electrical contact as the leads come to rest. The pair of knife edges per contact further serve to prevent skewing of the leads with respect to the direction of feed and avoid more than a low contact operating force which might otherwise unduly bend or deflect a lead. For adjusting heightwise minimal spacing between cooperating knife edges of the contacts, a pair of studs 96 (one shown in FIG. 9) is threaded vertically through the support 80 for endwise engagement with an end portion thereof and each stud carries a locknut 98.

Each of the contact supports 80 is secured to a shiftable operating assembly comprising a bar 100 projecting transversely of the conveyor path from a lever 102. This lever at one end carries a follower roll 104 having peripheral engagement with the cam 40, and at the other end is fulcrumed to the housing 38. A spring 106 (FIGS. 2, 7) normally maintains engagement of the roll 104 with the cam 40 cyclically to control rise and descent of the upper contacts 72 for engagement and transverse penetration of the successive leads. However, as indicated in FIGS. 1 and 2, upon occasion such as the need to replace a faulty component found disqualified by electrical test at the station 18, an operator may simply turn the lever 102 clockwise to its dashline position shown in FIG. 1. The spring 106 in cooperation with a stop pin 108 in the housing will then hold the lever 102 and the raised supports 80 in an out-of-the way position while a fresh component C is manually substituted across the lower contacts 70,70 to be tested when the contacts 72 are again lowered into lead engaging position. It will be understood that failure of a component to qualify as acceptable at the station 18 will at once deenergize the conveyor drive system, and that it will be automatically re-energized upon meeting predetermined electrical requirement. Appropriate test current and voltage for the respective components successively lead-engaged by the contacts 70,72 is administered by circuitry not herein shown, control and timing of the tests preferably being derived from computer-dictated pulsing. For convenience a compartmented receptacle (not shown) for supplying the different replacement components C is customarily provided adjacent to the test station.

Certain components, such as disc caps, which have bodies and lead portions which are non-aligned, i.e. have lead portions non-coaxial adjacent to their bodies, may require means for controlling the orientation of such bodies relative to their coaxial lead portions. Thus an elongated stationary thin strip 110 (FIG. 3, 7) anchored at one end to the conveyor frame, and extending parallel to and supported by its drive chain from a point upstream of the dispensers 14 to the station 12, is arranged to prevent the bodies from rotating excessively (due to gravity) about their coaxial lead portions and becoming fouled in the chain. At the point of entry into the transfer mechanism 16, an extension 118 (FIGS. 7, 9) of the strip 110 engages non-aligned bodies such as those of disc caps to support them. On reaching the station 18 the coaxial lead portions L being urged to roll downstream upon the lower contacts 70 may urge the non-aligned bodies such as disc caps counterclockwise as seen in FIGS. 5-9 and 9. Accordingly, a leaf-spring deflector 112 (FIG. 9) is attached to the support 80 and has a free depending portion engageable with the component body to limit the counterclockwise rotation thereof to less than 90°, as illustrated by the disc cap C shown in FIG. 9.

Figure 7:
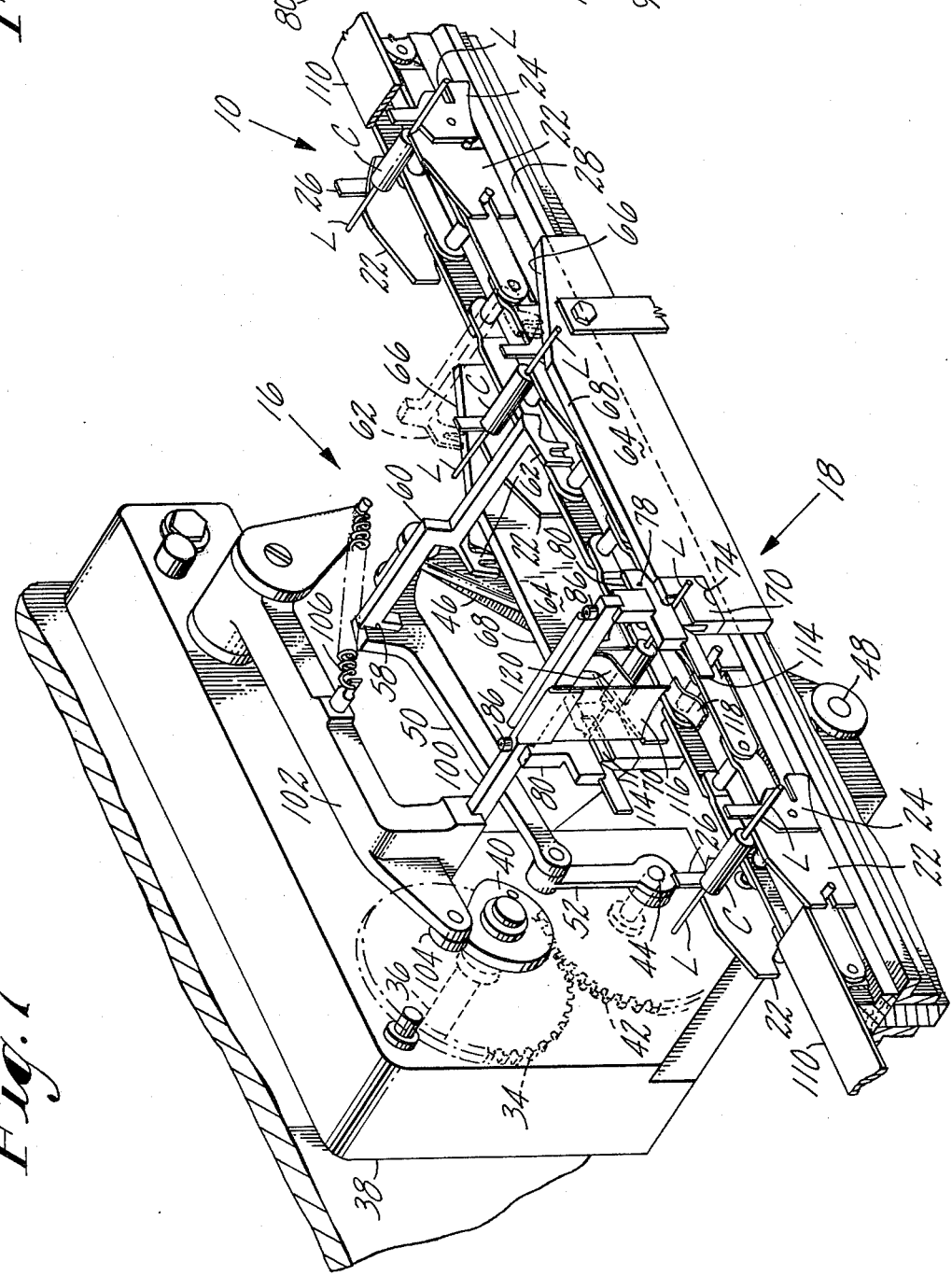
FIG. 7 is a perspective view of the component test station and associated transfer mechanism.

After a testing cycle, if a component has been found acceptable, the pick-off fingers 26 previously engaging its leads L will again propel them downstream as indicated in FIGS. 7 and 9. In order to maintain the coaxial lead portions in parallel relation and substantially non-skewed, widthwise-spaced guides 114,114 are affixed to the support 80 and respectively have lead-engaging under surfaces inclined downwardly in the direction of feeding to deflect the leads downward into their respective carrier "pockets" between the leading and trailing side plates 22,24. Resilient deflector sheet 116,116 (FIGS. 7, 9), for instance of rubber, are suspended from the bar 100 to engage, stabilize, and deflect the component leads L, in conjunction with the guides 114,114 so that the leads are returned into their respective carrier pockets. The upper surface of a body such as a disc cap which has been tested is prevented from any further counterclockwise motion by engagement with a central resilient deflector 120 secured at its upper end to the bar 100. Consequently the restraints mentioned insure that all components are tested while momentarily stationary and then redeposited in appropriate orientation within their conveyor "pockets", respectively, prior to further treatment, such as retaping at the station 12.

It may be noted that the present disclosure, as contrasted with that of the cited U.S. Pat. No. 4,119,206, makes unnecessary the provision of an auxilliary test station for electrically pretesting replacement components C prior to their substitution in the component sequence.

Briefly to review operation of the machine and more especially the functioning of the test station 18, it will be assumed that the carriers 20 are each loaded with a component C picked off from the dispensers 14, respectively, by the successive pairs of fingers 26 for forwarding toward the test station by the conveyor 10. Electronic means (not shown) preferably is provided for determining the order in which components are to be fed, assuming a predetermined order is desired, as well as establishing a proper program of testing at the station 18 for the selected component sequence. It will be appreciated that the invention not only assures that the station 18 makes rapid and reliable electric tests of the appropriate type for each component fed, but that only acceptable components are passed on for further processing, for instance taping and reeling at the station 12.

Upon engagement of the successive coaxial lead portions of a component C with the ramp portions 66, the pair of fingers 26 engaging those lead portions, respectively, raises the component on the ramp to the horizontal rail portions 68. Timing of the four-bar linkage 46, 50 and 52 is such that the forked pickers 62,62, as indicated in FIG. 5, are lowered over the leads L before reaching the locality of intersection of the ramps 66 with the rail portions 68,68. Now the pickers 62 accelerate downstream ahead of the fingers 26 which had been propelling the component in order to present its leads between the contact sets 70,72. It is to be observed that, by way of distinction over the disclosure in the cited U.S. Pat. No. 4,119,206, wherein the leads had to fully stop prior to contact engagement therewith, the relatively closed lead contact sets 70,72 are yieldingly opened heightwise for the electrical testing by the arrival and contact-displacing motion of the leads before they are released from the pickers 62. This is to say that the leads are brought to rest upon the lower contacts 70, the knife edges 94 thereof as well as the knife edges 94 of the upwardly yieldable contact 72 transversely penetrating any oxidized exterior of the leads as they are caused to stop. This arrangement advantageously provides a greater percentage of the sequence verifying cycle to be available during which a component can be tested, and provides a good electrical contact for an accurate and reliable test while imposing only a low, non-lead bending operating force. Should resistance (due to compression of the springs 90,90) to arrest the leads at the station 18 be insufficient, the stop surface 92, of the support 80 acts positively to position the leads for static testing. The pickers 62,62 are raised and retracted (to the right as seen in FIGS. 1, 2, 5 and 7) from the test station to repeat a transfer cycle for a succeeding component during completion of the electric test of the component delivered to the station 18.

Upon releasing a tested component C by elevation of the contacts 72 due to raising of the support 80 by operation of the rise on the cam 40, that component is returned to its conveyor carrier 20 as above explained provided the electric test at the station 18 has been satisfactorily passed. If not, the conveyor 10 has been stopped automatically and the defective component C will be discarded upon relatively lifting the upper portion of the test assembly, i.e. the supports 80, contacts 72, bar 100 and the lever 102 with its roll 104, whereupon a fresh component is substituted directly into the station 18 and the designated test parts lowered for a testing.

From the foregoing it will be apparent that the invention provides an effective, uncomplicated electric component test station and one that can be employed to repeat testing at high rate with little or no difficulty attributable to contact failure.

Having thus described my invention, what I claim as new and desired to secure as Letters Patent of the United States is:

1. A machine for processing electronic components of a kind having portion of their leads extending from their bodies along a common axis, said machine comprising: means for advancing the components along a path; a pair of electrical contact sets lying in said path and spaced apart from one another so that each set engages one of the component leads, each set including at least two lead-engaging members, at least one of which is yieldably mounted and arranged relative to the other member to be displaced by an advancing lead so as to retard said lead, means for connecting the contact sets in electrical circuitry for determining acceptability of individual components according to predetermined electrical requirements and interrupting operation of the machine if a component is not acceptable, and means for releasing the component through the machine if it is acceptable.

2. Mechanism as in claim 1 wherein at least one of the contacts of each set is formed with an abrading edge arranged to transversely penetrate any oxidized exterior of the lead as it is being arrested.

3. Mechanism for electrically testing components by engagement with their leads respectively, comprising:
   a pair of separate lead engageable contact sets electrically connects to test circuitry, said contact sets each including a pair of contacts, one of which is a fixed contact and the other of which is a movable contact, the movable contact being yieldable and relatively separable from the fixed contact in response to movement into engagement therewith by a lead of a component, the movable contacts being in substantial alignment with the fixed contacts, at least a portion of the engageable surfaces of the movable contacts being substantially convergent with the lead engageable surfaces of the fixed contacts and mounted for effecting substantially equal relative lead retardation of a pair of leads respectively;
   means for resiliently mounting the movable contacts to permit their displacement whereby upon lead retardation engagement the component is tested.

4. Mechanism as in claim 3 wherein the movable contact is mounted for pivotal movement about an axis extending substantially parallel to the leads to be engaged thereby for testing.

5. Mechanism as in claim 3 and power means for presenting successively between the fixed and movable contacts of the spaced sets the coaxial lead portions of the leads of a series of electrical components, means for cyclically separating the movable contacts from the fixed contacts to interrupt said electrical connection to the test circuitry, and mechanism for operating said power means and said contact separating means in synchronism.

6. Mechanism as in claim 3 wherein each of the contacts of the sets is provided with adjacent, parallel knife edges for penetratively engaging opposite sides of the respective leads during testing.

7. In a machine for processing electrical components having wire leads extending from their bodies in at least partly coaxial relation, the machine comprising:
   a series of operating stations one of which is adapted to test the respective components in rapid sequence, the test station being electrically connected to circuitry for determining acceptability of the individual components according to appropriate requirements established therefor; mechanism adjacent to said test station for advancing along a path therein, in parallel relation, the successive component coaxial leads, a pair of spaced contact sets arranged adjacent to said path, each set including a fixed lead-engageable contact and a movable contact positioned against the fixed contact by a spring-loaded electrically conductive pin bearing on the movable contact, the arrangement being such that the said lead advancing mechanism causes the leads of each component to engage and relatively open the movable contacts with respect to the closed contacts and against the influence of said spring-loaded pins thus to arrest each component body for testing between said sets.

8. A machine as in claim 7 wherein the contacts of each set are formed with adjacent knife edges adapted to transversely penetrate the oxidized exterior of each lead engaged thereby.

9. A machine as in claim 7 wherein power means is provided to cyclically shift the movable contacts and said pins bodily toward and away from said path to facilitate removal of a component found faulty and replacement by a fresh component to be tested.

10. A machine as in claim 7 including in said test station, resilient restraint means for limiting angular orientation of component bodies relative to the axis of their coaxial lead portions.

11. A machine as in claim 7 wherein the movable contacts are pivotally carried by a support for movement about an axis extending generally parallel to coaxial lead portions of the components to be tested, and a lead-engageable surface of said support is formed with a lead engageable abutment extending parallel to said axis positively to stop and position relative to said fixed contacts any component not fully arrested by the upper and lower contacts.

* * * * *

UNITED STATES PATENT OFFICE
CERTIFICATE OF CORRECTION

Patent No. 4,320,339  Dated March 16, 1982

Inventor(s) Stanley R. Vancelette

It is certified that error appears in the above-identified patent and that said Letters Patent are hereby corrected as shown below:

Column 7 - Line 19, change "portion" to "portions"

Column 7 - Line 43, change "connects" to "connected"

Signed and Sealed this

Eighteenth Day of May 1982

[SEAL]

Attest:

Attesting Officer

GERALD J. MOSSINGHOFF

Commissioner of Patents and Trademarks